(12) United States Patent
Wu et al.

(10) Patent No.: US 11,587,956 B2
(45) Date of Patent: Feb. 21, 2023

(54) ARRAY SUBSTRATE, METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Bo Wu, Beijing (CN); Yin Deng, Beijing (CN); Dongmei Wei, Beijing (CN); Hao Luo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/461,731

(22) Filed: Aug. 30, 2021

(65) Prior Publication Data

US 2022/0077196 A1 Mar. 10, 2022

(30) Foreign Application Priority Data

Sep. 4, 2020 (CN) .......................... 202010925764.7

(51) Int. Cl.
*G02F 1/1343* (2006.01)
*H01L 27/12* (2006.01)
*G02F 1/1362* (2006.01)
*G02F 1/1368* (2006.01)

(52) U.S. Cl.
CPC ...... *H01L 27/124* (2013.01); *G02F 1/136295* (2021.01); *H01L 27/1296* (2013.01); *G02F 1/1368* (2013.01); *G02F 1/134363* (2013.01)

(58) Field of Classification Search
CPC ............... H01L 27/124; H01L 27/1296; G02F 1/136295; G02F 1/134363; G02F 1/1368; G02F 1/13338; G02F 1/134372
See application file for complete search history.

(56) References Cited

U.S. PATENT DOCUMENTS

2016/0357310 A1\* 12/2016 Wang .................... G06F 3/0412

\* cited by examiner

*Primary Examiner* — James A Dudek
(74) *Attorney, Agent, or Firm* — IPro, PLLC

(57) ABSTRACT

An array substrate includes a gate layer, a first insulating layer, a channel layer, a source-drain layer, a second insulating layer, and a common electrode layer that are sequentially stacked, wherein the second insulating lay is provided with via holes formed therein; and the source-drain layer includes a plurality of sources, a plurality of drains, a plurality of data lines and a plurality of common electrode signal lines. The common electrode signal line includes a plurality of common electrode signal line segments, each of the common electrode signal line segments passes through at least one sub-pixel row, and each of the common electrode signal line segments is connected to the common electrode layer through the via hole.

19 Claims, 10 Drawing Sheets

ARRAY SUBSTRATE, METHOD FOR MANUFACTURING SAME, AND DISPLAY DEVICE

CROSS-REFERENCE TO RELATED APPLICATION

This application claims priority to Chinese Patent Application No. 202010925764.7, filed on Sep. 4, 2020, and entitled "ARRAY SUBSTRATE, DISPLAY DEVICE, AND METHOD FOR MANUFACTURING ARRAY SUBSTRATE", the disclosure of which is herein incorporated by reference in its entirety.

TECHNICAL FIELD

The present disclosure relates to the field of display technologies, and in particular to an array substrate, a display device, and a method for manufacturing an array substrate.

BACKGROUND

There are many types of liquid crystal displays. For example, liquid crystal displays with an array substrate based on a dual-gate structure is commonly used currently. In the array substrate based on the dual-gate structure, during driving for display, due to the capacitive coupling effect of the due-gate structure, the luminance of two adjacent sub-pixel columns with positive voltage polarities is generally higher, while the luminance of two adjacent sub-pixel columns with negative voltage polarities is lower. As a result, visually alternative bright and dark streaks in one frame of image occur, which presents the phenomenon of vertical lines. In order to improve the vertical lines, those skilled in the art adopt an array substrate with a Z1 structure.

SUMMARY

The present disclosure provides an array substrate, a method for manufacturing the same, and a display device. The technical solutions are as follows.

In an aspect, the present disclosure provides an array substrate. The array substrate includes: a gate layer, a first insulating layer, a channel layer, a source-drain layer, a second insulating layer, and a common electrode layer that are sequentially stacked, the second insulating layer comprising via holes formed therein, wherein the source-drain layer includes a plurality of sources, a plurality of drains, a plurality of data lines and a plurality of common electrode signal lines, wherein the common electrode signal line includes a plurality of common electrode signal line segments, each of the common electrode signal line segments passing through at least one sub-pixel row, and each of the common electrode signal line segments being connected to the common electrode layer through the via hole.

Optionally, the array substrate includes a plurality of pixel units arranged in an array, wherein each of the pixel units includes a plurality of sub-pixels of different colors, a first strip-shaped area is between adjacent two sub-pixel rows, and a second strip-shaped area is between adjacent two sub-pixel columns, each of the data lines includes a plurality of row extension connection units and a plurality of column extension connection units, one column extension connection unit being connected between every two row extension connection units, wherein the plurality of column extension connection units includes a plurality of first column extension connection units and a plurality of second column extension connection units, a first end of any row extension connection unit being connected to one of the first column extension connection units, and a second end of the any row extension connection unit being connected to one of the second column extension connection units; the plurality of row extension connection units in a same data line are respectively disposed in a plurality of first strip-shaped areas between a same group of sub-pixel columns, each group of sub-pixel columns comprising at least one sub-pixel column; the plurality of first column extension connection units in a same data line are all disposed in a same second strip-shaped area; and the plurality of the second column extension connection units in a same data line are disposed in another second strip-shaped area, each of the column extension connection units passing through one sub-pixel row; and the plurality of common electrode signal line segments are all disposed in the second strip-shaped areas, each of the common electrode signal line segments passes through one sub-pixel row, and the common electrode signal line segments and the column extension connection units are disposed alternately in a plurality of second strip-shaped areas between sub-pixels in a same sub-pixel row.

Optionally, the gate layer includes a plurality of gate lines and a plurality of gates, two of the gate lines being disposed side by side in a same first strip-shaped area, and the gate line extending in an extending direction of the first strip-shaped area; and for any pixel unit in any row, a gate of a first sub-pixel in the pixel unit is connected to one of a first gate line and a second gate line, and a gate of a second sub-pixel in the pixel unit is connected to the other one of the first gate line and the second gate line; and gates of third sub-pixels in two pixel units adjacent to the pixel unit are respectively connected to the first gate line and the second gate line, wherein the first gate line is disposed on an upper side of the any pixel unit and is adjacent to the any pixel unit, and the second gate line is disposed on a lower side of the any pixel unit and is adjacent to the any pixel unit.

Optionally, the plurality of row extension connection units includes first row extension connection units and second row extension connection units that are alternately disposed sequentially in rows, wherein the first row extension connection unit includes a first connection segment, a second connection segment and a third connection segment that are sequentially connected, wherein both the first connection segment and the third connection segment extend in an extending direction of the first strip-shaped area, and an acute angle is formed between an extending direction of the second connection segment and the extending direction of the first strip-shaped area; and the second row extension connection unit includes a fourth connection segment, a fifth connection segment, a sixth connection segment, a seventh connection segment and an eighth connection segment that are sequentially connected, wherein both the fifth connection segment and the seventh connection segment extend in a direction opposite to the extending direction of the first strip-shaped area; an acute angle is formed between the direction opposite to the extending direction of the first strip-shaped area and each of an extending direction of the fourth connection segment, an extending direction of the sixth connection segment and an extending direction of the eighth connection segment; the fourth connection segment, the fifth connection segment and the sixth connection segment enclose a first recessed area; and the sixth connection segment, the seventh connection segment and the eighth connection segment enclose a second recessed area, an opening direction of the first recessed area facing an extending direction of the second strip-shaped area, and an opening direction of the second recessed area being opposite to the extending direction of the second strip-shaped area.

Optionally, a thin film transistor of a fourth sub-pixel is disposed in the first strip-shaped area between the first connection segment and the fourth sub-pixel, a thin film transistor of a fifth sub-pixel is disposed in the first recessed area, a thin film transistor of a sixth sub-pixel is disposed in the second recessed area, and a thin film transistor of a seventh sub-pixel is disposed in the first strip-shaped area between the third connection segment and the seventh sub-pixel, wherein the fourth sub-pixel is backed by an opening of the first recessed area, the fifth sub-pixel is disposed on a side of the opening of the first recessed area, the sixth sub-pixel is disposed on a side of an opening of the second recessed area, and the seventh sub-pixel is backed by the opening of the second recessed area.

Optionally, the plurality of common electrode signal line segments includes a first common line segment and a second common line segment, wherein the first common line segment is disposed between the fourth sub-pixel and the sixth sub-pixel, a first end of the first common line segment extending toward the thin film transistor of the fourth sub-pixel, and a second end of the first common line segment extending toward the thin film transistor of the sixth sub-pixel; and the second common line segment is disposed between the fifth sub-pixel and the seventh sub-pixel, a first end of the second common line segment extending toward the thin film transistor of the fifth sub-pixel, and a second end of the second common line segment extending toward the thin film transistor of the seventh sub-pixel.

Optionally, both ends of at least one of the first common line segment and the second common line segment extend from the second strip-shaped area to the first strip-shaped area.

Optionally, the plurality of row extension connection units includes third row extension connection units and fourth row extension connection units alternately arranged sequentially in rows, wherein the third row extension connection unit includes a ninth connection segment, a tenth connection segment, an eleventh connection segment, a twelfth connection segment, a thirteenth connection segment, and a fourteenth connection segment that are sequentially connected, wherein each of the ninth connection segment, the eleventh connection segment and the thirteenth connection segment extends along an extending direction of the first strip-shaped area; an acute angle is formed between the extending direction of the first strip-shaped area and each of an extending direction of the tenth connection segment, an extending direction of the twelfth connection segment and an extending direction of the fourteenth connection segment; the tenth connection segment, the eleventh connection segment and the twelfth connection segment enclose a third recessed area; and the twelfth connection segment, the thirteenth connection segment and the fourteenth connection segment enclose a fourth recessed area, an opening direction of the fourth recessed area facing an extending direction of the second strip-shaped area, and an opening direction of the third recessed area being opposite to the opening direction of the fourth recessed area; and the fourth row extension connection unit includes a fifteenth connection segment, a sixteenth connection segment, a seventeenth connection segment, an eighteenth connection segment, a nineteenth connection segment and a twentieth connection segment that are sequentially connected, wherein each of the fifteenth connection segment, the seventeenth connection segment and the nineteenth connection segment extends in a direction opposite to the extending direction of the first strip-shaped area; an acute angle is formed between the direction opposite to the extending direction of the first strip-shaped area and each of an extending direction of the sixteenth connection segment, an extending direction of the eighteenth connection segment and an extending direction of the twentieth connection segment; the sixteenth connection segment, the seventeenth connection segment and the eighteenth connection segment enclose a fifth recessed area; and the eighteenth connection segment, the nineteenth connection segment and the twentieth connection segment enclose a sixth recessed area, an opening direction of the sixth recessed area facing the extending direction of the second strip-shaped area, and an opening direction of the fifth recessed area being opposite to the opening direction of the sixth recessed area.

Optionally, a thin film transistor of an eighth sub-pixel is disposed in the fourth recessed area, a thin film transistor of a ninth sub-pixel is disposed in the first strip-shaped area between the ninth sub-pixel and the ninth connection segment, a thin film transistor of a tenth sub-pixel is disposed in the first strip-shaped area between the tenth sub-pixel and the fifteenth connection segment, and a thin film transistor of an eleventh sub-pixel is disposed in the sixth recessed area, wherein the eighth sub-pixel is disposed on a side of an opening of the fourth recessed area, the ninth sub-pixel is backed by an opening of the sixth recessed area, the tenth sub-pixel is backed by the opening of the fourth recessed area, and the eleventh sub-pixel is disposed on a side of the opening of the sixth recessed area.

Optionally, the plurality of common electrode signal line segments includes a third common line segment and a fourth common line segment, wherein the third common line segment is disposed between the eighth sub-pixel and the ninth sub-pixel, a first end of the third common line segment being backed by an opening of the third recessed area, and a second end of the third common line segment being disposed in the fifth recessed area; and the fourth common line segment is disposed between the tenth sub-pixel and the eleventh sub-pixel, a first end of the fourth common line segment being backed by an opening of the fifth recessed area, and a second end of the fourth common line segment being disposed in the third recessed area.

Optionally, the plurality of row extension connection units includes fifth row extension connection units and sixth row extension connection units that are alternately arranged sequentially in rows, wherein the fifth row extension connection unit includes a twenty-first connection segment, a twenty-second connection segment, a twenty-third connection segment, a twenty-fourth connection segment, a twenty-fifth connection segment and a twenty-sixth connection segment that are sequentially connected, wherein each of the twenty-second connection segment, the twenty-fourth connection segment and the twenty-sixth connection segment extends along an extending direction of the first strip-shaped area; an acute angle is formed between the extending direction of the first strip-shaped area and each of an extending direction of the twenty-first connection segment, an extending direction of the twenty-third connection segment, and an extending direction of the twenty-fifth connection segment; the twenty-first connection segment, the twenty-second connection segment and the twenty-third connection segment enclose a seventh recessed area; and the twenty-third connection segment, the twenty-fourth connection segment and the twenty-fifth connection segment enclose an eighth recessed area, an opening direction of the eighth recessed area facing an extending direction of the second strip-shaped area, and an opening direction of the seventh recessed area being opposite to the opening direction of the eighth recessed area; and the sixth row extension connection unit includes a twenty-seventh connection segment, a twenty-eighth connection segment, a twenty-ninth connection segment, a thirtieth connection segment, a thirty-first connection segment and a thirty-second connection segment that are sequentially connected, wherein each of the twenty-eighth connection segment, the thirtieth connection segment and the thirty-second connection segment extends in a direction opposite to the extending direction of the first strip-shaped area; an acute angle is formed between the direction opposite to the extending direction of the first strip-shaped area and each of an extending direction of the twenty-seventh connection segment, an extending direction of the twenty-ninth connection segment, and an extending direction of the thirty-first connection segment; the twenty-seventh connection segment, the twenty-eighth connection segment and the twenty-ninth connection segment enclose a ninth recessed area; and the twenty-ninth connection segment, the thirtieth connection segment and the thirty-first connection segment enclose a tenth recessed area, an opening direction of the tenth recessed area facing the extending direction of the second strip-shaped area, and an opening direction of the ninth recessed area being opposite to the opening direction of the tenth recessed area.

Optionally, a thin film transistor of a twelfth sub-pixel is disposed in the ninth recessed area, a thin film transistor of a thirteenth sub-pixel is disposed in the first strip-shaped area between the thirteenth sub-pixel and the thirty-second connection segment, a thin film transistor of a fourteenth sub-pixel is disposed in the seventh recessed area, and a thin film transistor of a fifteenth sub-pixel is disposed in the first strip-shaped area between the fifteenth sub-pixel and the twenty-sixth connection segment, wherein the twelfth sub-pixel is disposed on a side of an opening of the ninth recessed area, the thirteenth sub-pixel is backed by an opening of the seventh recessed area, the fourteenth sub-pixel is disposed on a side of the opening of the seventh recessed area, and the fifteenth sub-pixel is backed by the opening of the ninth recessed area.

Optionally, the plurality of common electrode signal line segments further includes a fifth common line segment and a sixth common line segment, wherein the fifth common line segment is disposed between the twelfth sub-pixel and the thirteenth sub-pixel, a first end of the fifth common line segment being disposed in the eighth recessed area, and a second end of the fifth common line segment being backed by an opening of the tenth recessed area; and the sixth common line segment is disposed between the fourteenth sub-pixel and the fifteenth sub-pixel, a first end of the sixth common line segment being disposed in the tenth recessed area, and a second end of the sixth common line segment being backed by an opening of the eighth recessed area.

Optionally, the via holes are all disposed in first strip-shaped areas.

Optionally, a drain of a sub-pixel in the sub-pixel row is connected to a pixel electrode, and all the pixel electrodes on the array substrate are equal in area.

Optionally, the common electrode layer includes a plurality of common electrodes arranged in an array.

Optionally, a second strip-shaped area passing through any sub-pixel row includes a first gap and a second gap, an angle being formed between the first gap and the second gap.

Optionally, a material of the common electrode layer includes a light-transmitting material.

In another aspect, the present disclosure provides a display device. The display device includes an array substrate, and the array substrate includes: a gate layer, a first insulating layer, a channel layer, a source-drain layer, a second insulating layer, and a common electrode layer that are sequentially stacked, the second insulating layer comprising via holes formed therein; wherein the source-drain layer includes a plurality of sources, a plurality of drains, a plurality of data lines and a plurality of common electrode signal lines, wherein the common electrode signal line includes a plurality of common electrode signal line segments, each of the common electrode signal line segments passing through at least one sub-pixel row, and each of the common electrode signal line segments being connected to the common electrode layer through the via hole.

In still another aspect, the present disclosure provides a method for manufacturing an array substrate. The method includes: forming a gate layer, a first insulating layer, a channel layer, a source-drain layer, and a second insulating layer sequentially on a substrate, wherein the source-drain layer includes a plurality of sources, a plurality of drains, a plurality of data lines and a plurality of common electrode signal lines, the common electrode signal line comprising a plurality of common electrode signal line segments, each of the common electrode signal line segments passing through at least one sub-pixel row; forming via holes in the second insulating layer; and forming a common electrode layer on the substrate on which the second insulating layer is formed, wherein each of the common electrode signal line segments is connected to the common electrode layer through the via hole.

DETAILED DESCRIPTION

Hereinafter, exemplary embodiments of the present disclosure are described in more detail with reference to accompanying drawings. Although the accompanying drawings show exemplary embodiments of the present disclosure, it should be understood that the present disclosure can be implemented in various ways and should not be limited by the embodiments set forth herein. On the contrary, these embodiments are provided to facilitate a more thorough understanding of the present disclosure and to fully convey the scope of the present disclosure to those skilled in the art.

It is noted that the technical terms and scientific terms used in the present disclosure shall have the general meaning understood by those skilled in the art to which the present disclosure belongs, unless otherwise indicated.

In the related art, a separate metal layer needs to be provided in an array substrate with the Z1 structure, so as to bridge common electrode signal lines by the separate metal layer. However, providing the separate metal layer increases the manufacturing process of the array substrate. Therefore, on the basis of ensuring an effective connection among the common electrode signal lines, how to reduce the manufacturing process of the array substrate is a technical problem to be solved urgently by those skilled in the art.

Figure 1:
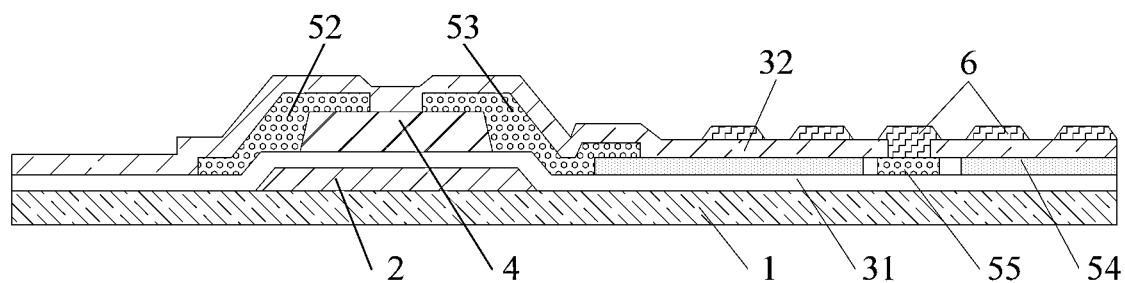
FIG. 1 schematically shows a schematic structural diagram of a section of an array substrate according to an embodiment of the present disclosure.
Figure 2:
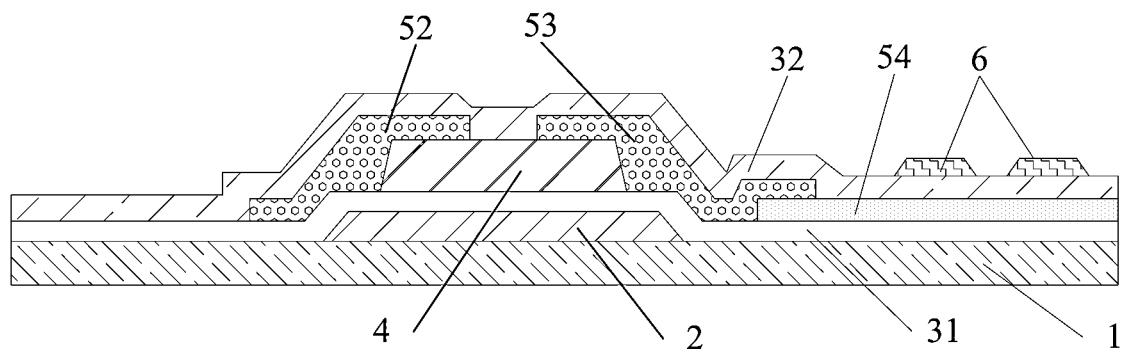
FIG. 2 schematically shows a schematic structural diagram of another section of an array substrate according to an embodiment of the present disclosure.

An embodiment of the present disclosure provides an array substrate. As shown in FIG. 1 to FIG. 12, the array substrate includes: a gate layer 2, a first insulating layer 31, a channel layer, a source-drain layer, a second insulating layer 32, and a common electrode layer 6 that are sequentially stacked on a substrate 1. Via holes are formed in the second insulating layer 32. Optionally, the first insulating layer 31 and the second insulating layer 32 may be made of insulating materials. FIG. 1 is a schematic diagram of a section of the array substrate at the via hole, and FIG. 2 is a schematic diagram of a section, without the via hole, of the array substrate.

Figure 3:
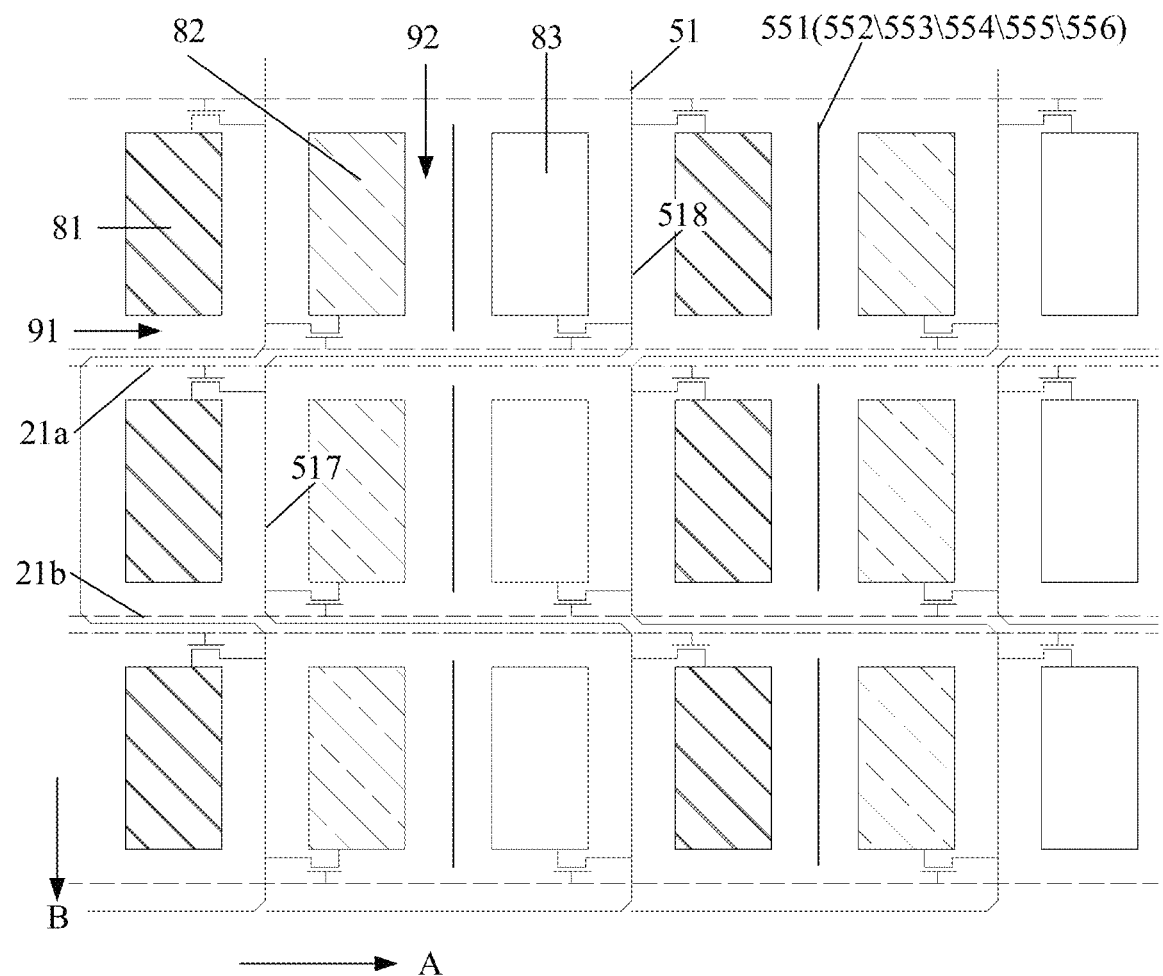
FIG. 3 schematically shows a schematic structural diagram of an array substrate according to an embodiment of the present disclosure.

As shown in FIG. 1 to FIG. 3, the source-drain layer includes a plurality of sources 52, a plurality of drains 53, a plurality of data lines 51, and a plurality of common electrode signal lines 55. As shown in FIG. 3, the common electrode signal lines include a plurality of common electrode signal line segments 551, 552, 553, 554, 555, and 556. Each of the common electrode signal line segments passes through at least one sub-pixel row, and each of the common electrode signal line segments is connected to the common electrode layer 6 through the via hole. The common electrode signal line 55 and the common electrode layer 6 jointly transmit a common voltage (com voltage).

It can be seen from the above that, by connecting each common electrode signal line segment to the common electrode layer, an effective connection among the plurality of common electrode signal line segments can be achieved. In addition, since the common electrode signal line is disposed in the same layer as the sources, the drains, and the data lines, the arrangement of the common electrode signal line does not increase the process difficulty or production cost. Additionally, when the common electrode signal line is made of the same material as the sources, the drains, and the data lines, the common electrode signal line, the sources, the drains, and the data lines may be formed by one-time patterning process, without the need to separately provide a mask for the common electrode signal line 55, which can further reduce the manufacturing process of the array substrate.

In addition, the common electrode signal line 55 and the common electrode layer 6 jointly transmit the com voltage, which is equivalent to the connection of a resistor in parallel to the common electrode layer 6. Therefore, the impedance is low during the transmission of the com voltage, that is, the impedance during the transmission of the com voltage is reduced. Thus, by connecting each common electrode signal line segment to the common electrode layer, not only a jump connection of the common electrode signal line through the common electrode layer is achieved, but also the resistance of the common electrode signal line is reduced, which improves the uniformity of the common electrode signal line.

Optionally, the common electrode layer 6 may be made of a light-transmitting conductive material such as indium tin oxide (ITO). Alternatively, the common electrode signal line 55 may be made of a metal material, and the impedance of the common electrode signal line 55 is lower than that of the common electrode layer 6, so as to further reduce the impedance during the transmission of the com voltage.

In addition, if the array substrate is to be applied to a touch and display driver integration (TDDI) design, the impedance during the transmission of the com voltage needs to be reduced. In the array substrate according to the embodiment of the present disclosure, by disposing the common electrode signal line 55 in the same layer as the data line 51, the source 52, and the drain 53, not only the array substrate in the embodiment of the present disclosure can be basically applied to the TDDI design, but also a separate metal layer is omitted in this solution as compared with the prior art, which can reduce the thickness of the array substrate.

The array substrate includes a plurality of pixel units arranged in an array. Each pixel unit includes a plurality of sub-pixels of different colors, and a first strip-shaped area 91 is between two adjacent sub-pixel rows and a second strip-shaped area 92 between two adjacent sub-pixel columns. The first strip-shaped area 91 and the second strip-shaped area 92 are arranged in a crisscross fashion. For example, each pixel unit may include three sub-pixels of different colors arranged in sequence along a first direction, each row of sub-pixels is arranged along the first direction, and each column of sub-pixels is arranged along a second direction. The three sub-pixels with different colors in the same pixel unit may be a first sub-pixel, a second sub-pixel, and a third sub-pixel. For example, the first sub-pixel 81 may be a red sub-pixel, the second sub-pixel 82 may be a green sub-pixel, and the third sub-pixel 83 may be a blue sub-pixel. As shown in FIG. 3, the direction indicated by arrow A is the first direction, and the direction indicated by arrow B is the second direction. In this case, the first direction is the extending direction of the first strip-shaped area 91, and the second direction is the extending direction of the second strip-shaped area 92.

Figure 8:
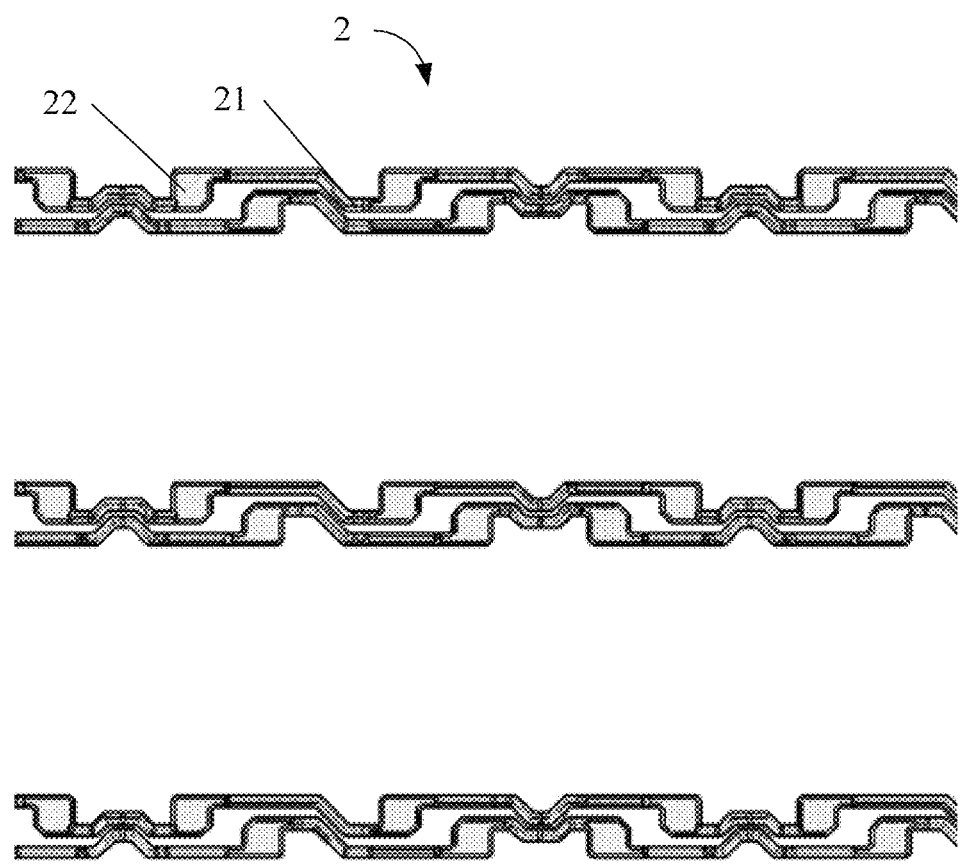
FIG. 8 schematically shows a schematic structural diagram of a gate layer of an array substrate according to an embodiment of the present disclosure.
Figure 11:
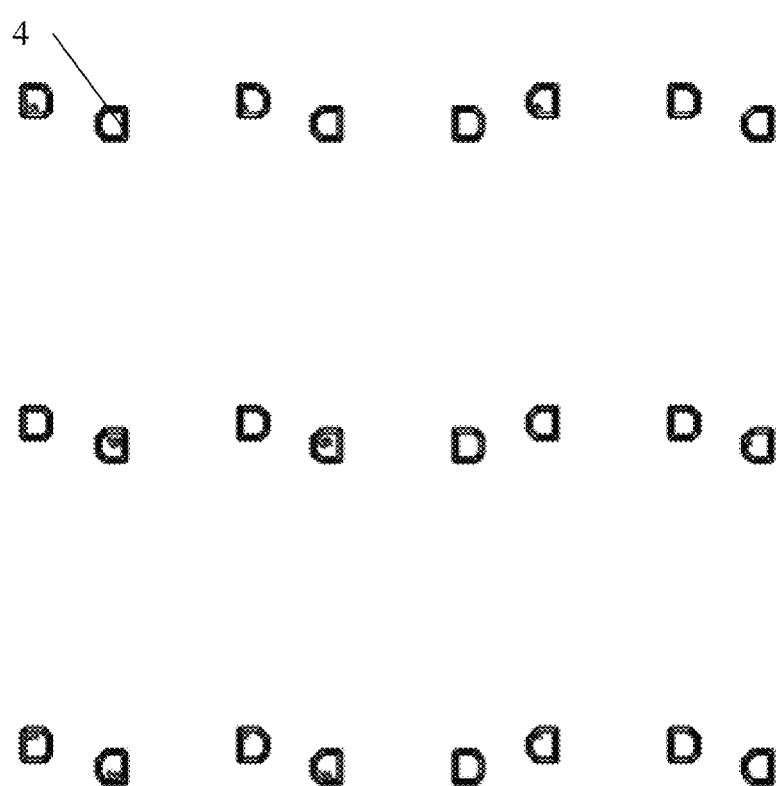
FIG. 11 schematically shows a schematic structural diagram of a channel of an array substrate according to an embodiment of the present disclosure.

As shown in FIG. 8, the gate layer 2 includes a plurality of gate lines 21 and a plurality of gates 22. As shown in FIG. 11, the channel layer includes a plurality of channels 4 and a plurality of pixel electrodes 54 (not shown in FIG. 11). The common electrode layer 6 includes a plurality of common electrodes arranged in an array. The pixel electrodes 54 are configured to control deflection of liquid crystals in a liquid crystal display panel together with the common electrodes, so as to realize image display. In addition, the channel layer is disposed on the side of the first insulating layer 31 distal from the gate layer 2. The source 52 and the drain 53 are disposed on the side of the channel 4 distal from the first insulating layer 31. The data line 51 and the common electrode signal line 55 are both disposed on the side of the first insulating layer 31 distal from the gate layer 2. Therefore, in the embodiment of the present disclosure, the channel 4, the data line 51, the common electrode signal line 55 and the pixel electrode 54 may be disposed in the same layer.

In the embodiment of the present disclosure, the gate line 21 may extend along the extending direction of the first strip-shaped area, such as along the first direction. Optionally, two gate lines 21 are disposed side by side in the same first strip-shaped area 91, that is, the array substrate may be an array substrate with a dual-gate structure. In addition, the array substrate may adopt the Z1 structure, that is, for any pixel unit in any row, the gate 22 of a first sub-pixel 81 of the any pixel unit is connected to one of a first gate line and a second gate line, and the gate 22 of a second sub-pixel 82 of the any pixel unit is connected to the other one of the first gate line and the second gate line, and the gates of third sub-pixels in two pixel units adjacent to the any pixel unit are respectively connected to the first gate line and the second gate line. The first gate line is disposed on an upper side of the any pixel unit and is adjacent to the any pixel unit, and the second gate line is disposed on a lower side of the any pixel unit and is adjacent to the any pixel unit.

For example, as shown in FIG. 3, the gates 22 of the red sub-pixels and the gates 22 of the green sub-pixels in each row of pixel units are respectively connected to two different gate lines 21 on the upper and lower sides of the row of pixel units (for example, the adjacent gate line 21a at the upper side and the adjacent gate line 21b at the lower side which are disposed on different sides of the row of pixel units), and the gates 22 of the blue sub-pixels in two adjacent pixel units are respectively connected to the adjacent gate line 21a at the upper side and the adjacent gate line 21b at the lower side.

In the related art, the array substrate based on the dual-gate structure is adopted. During driving for display, due to the capacitive coupling effect of the due-gate structure, the luminance of two adjacent sub-pixel columns with positive voltage polarities is generally higher, while the luminance of two adjacent sub-pixel columns with negative voltage polarities is lower. As a result, visually alternative bright and dark streaks in one frame of image occur, which presents a phenomenon of vertical lines The array substrate in the embodiment of the present disclosure adopts the Z1 structure, which can solve the phenomenon of vertical lines, thereby improving the display effect of the display panel.

Optionally, as shown in FIG. 3, each data line 51 includes a plurality of row extension connection units and a plurality of column extension connection units. One column extension connection unit is connected between every two row extension connection units. The plurality of column extension connection units includes a plurality of first column extension connection units and a plurality of second column extension connection units. The first end of any row extension connection unit is connected to one first column extension connection unit, and the second end of the any row extension connection unit is connected to one second column extension connection unit. The plurality of row extension connection units in the same data line are respectively disposed in the plurality of first strip-shaped areas between the sub-pixel columns in the same group, and each group of sub-pixel columns includes at least one sub-pixel column.

The plurality of first column extension connection units in the same data line are disposed in the same second strip-shaped area, the plurality of second column extension connection units in the same data line are disposed in another second strip-shaped area, and each column extension connection unit passes through one sub-pixel row.

As shown in FIG. 3, when each column extension connection unit passes through one sub-pixel row, the plurality of common electrode signal line segments are all disposed in the second strip-shaped area, each common electrode signal line segment passes through one sub-pixel row, and the common electrode signal line segments and the column extension connection units are arranged alternately in columns in the plurality of second strip-shaped areas between the sub-pixels in the same sub-pixel row.

The gate 22, the channel 4, the source 52, and the drain 53 are configured to form the thin film transistor of a sub-pixel. The source 52 of the thin film transistor is connected to an adjacent data line 51, and the drain 53 is connected to the pixel electrode 54. In addition, the via hole, the thin film transistor, and the row extension connection unit may all be disposed in the first strip-shaped area 91. Optionally, the pixel electrode 54 may be made of an indium tin oxide (ITO) material.

Figure 4:
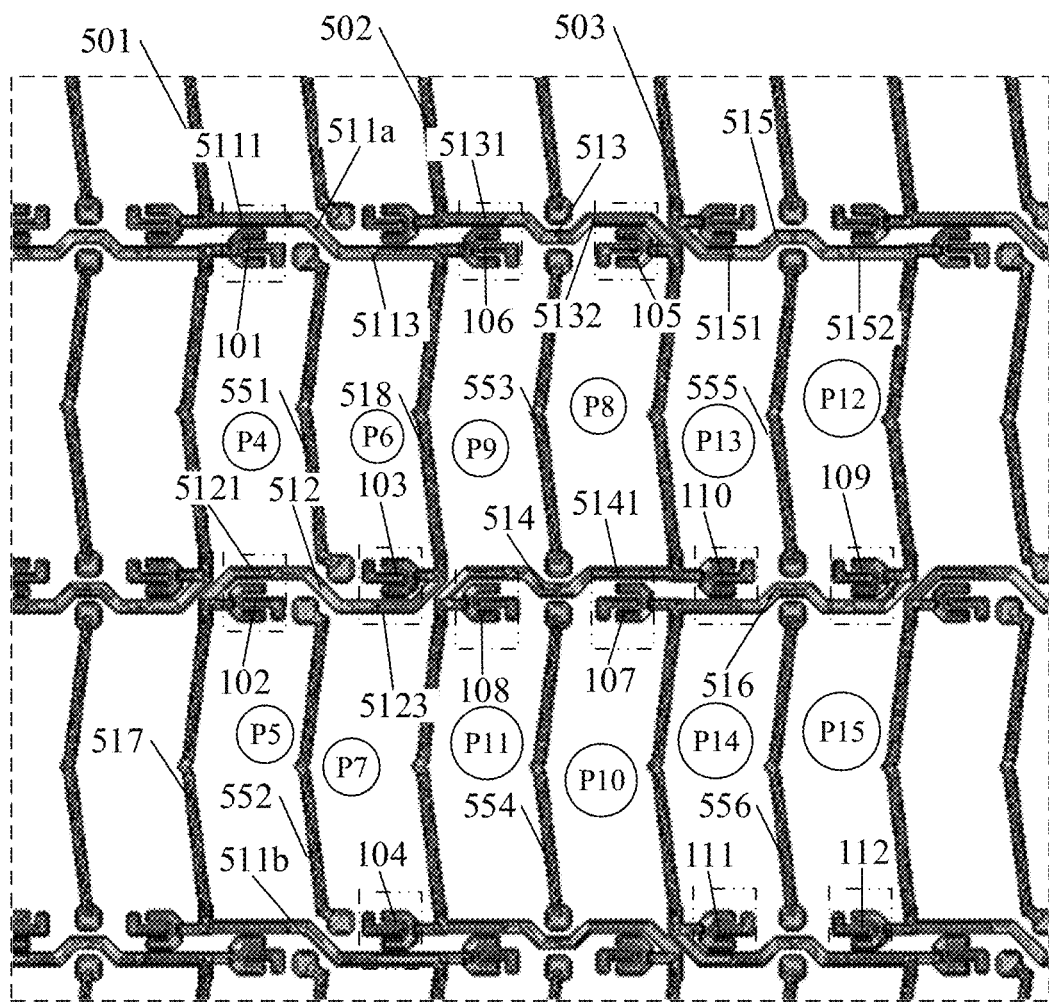
FIG. 4 schematically shows a schematic structural diagram of a source-drain layer of an array substrate according to an embodiment of the present disclosure, FIG. 5 schematically shows a schematic structural diagram of another source-drain layer of an array substrate according to an embodiment of the present disclosure.

It can be known from the above that the data line 51 in the embodiment of the present disclosure is in a serpentine shape. As shown in FIG. 3 and FIG. 4, the data line 51 includes a first column extension connection unit 517, a row extension connection unit, a second column extension connection unit 518, and another row extension connection unit sequentially connected. The plurality of row extension connection units in the same data line 51 all correspond to at least one same column of sub-pixels. The first column extension connection unit 517 and the second column extension connection unit 518 correspond to two adjacent sub-pixel rows, respectively. For example, the first sub-pixel row and the second sub-pixel row are adjacent and alternately arranged. In the first sub-pixel row, two adjacent first column extension connection units 517 belong to two different data lines 51 respectively, two sub-pixels are arranged between the two first column extension connection units 517, and one common electrode signal line 55 is disposed between the two adjacent first column extension connection units 517. Similarly, two adjacent second column extension connection units 518 belong to two different data lines 51 respectively, two sub-pixels are arranged between the two second column extension connection units 518, and one common electrode signal line 55 is disposed between the two second column extension connection units 518.

Figure 9:
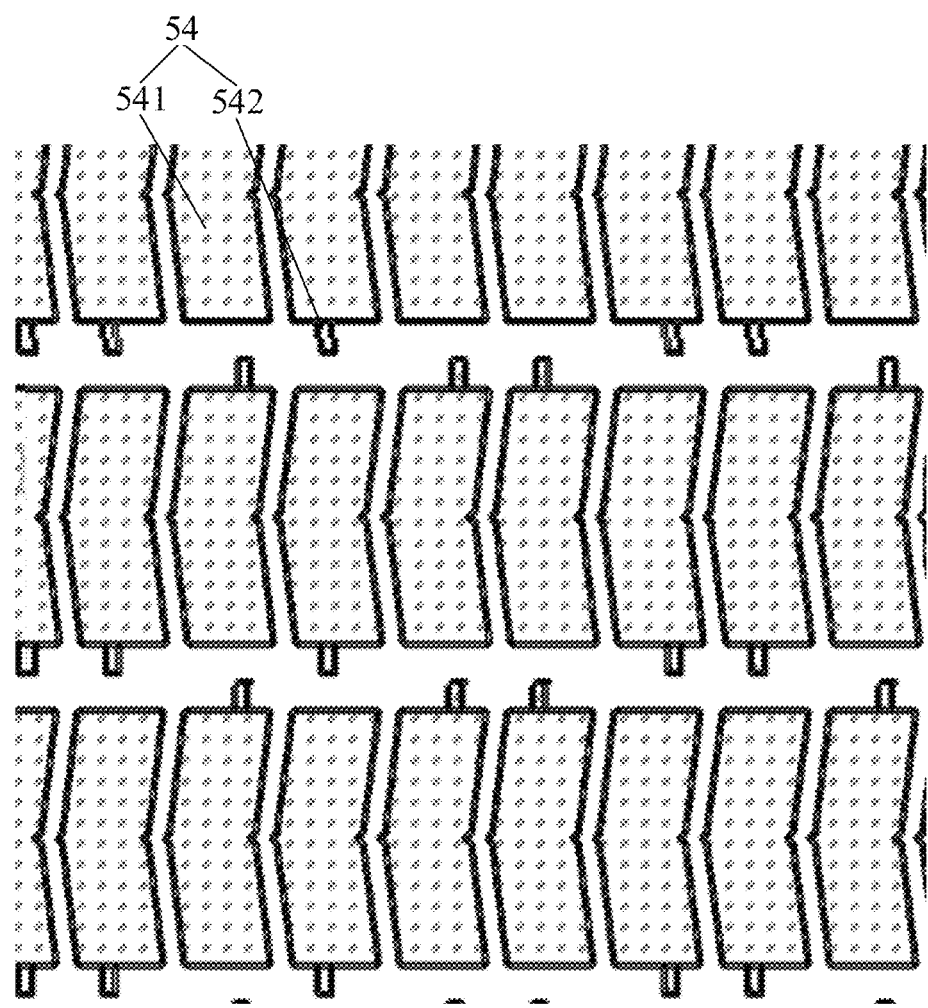
FIG. 9 schematically shows a schematic structural diagram of a pixel electrode of an array substrate according to an embodiment of the present disclosure, FIG. 10 schematically shows a schematic structural diagram of a common electrode of an array substrate according to an embodiment of the present disclosure.

Since the data line 51 in the embodiment of the present disclosure adopts a serpentine shape, the areas of the pixel electrodes 54 may be made equal to each other by a reasonable layout. As shown in FIG. 9, the areas of the plurality of pixel electrodes 54 are equal to each other. However, in the related art, as each data line is disposed in the same second strip-shaped area, and it cannot be ensured that the shapes of the pixel electrodes are consistent by setting the shapes of the thin film transistor and the pixel electrodes. As a result, the areas of the pixel electrodes are equal, which causes the structures of the corresponding storage capacitors to be asymmetric. The process variation easily leads to difference in the capacitance value of the capacitor, which may cause flickers. In the embodiments of the present disclosure, structures and areas of the pixel electrodes 54 may be made the same, so that the structures of the storage capacitors corresponding to the pixel electrodes 54 are symmetrical, to ensure that the capacitance values of the capacitors are equal, thereby avoiding flickers.

The purpose of the present disclosure and the solutions for solving the technical problems may be further implemented by adopting the following technical measures.

As shown in FIG. 4, the data lines 51 may include a first data line 501, a second data line 502, and a third data line 503 sequentially arranged along the first direction. The first data line 501, the second data line 502, and the third data line 503 are periodically arranged.

Figure 5:
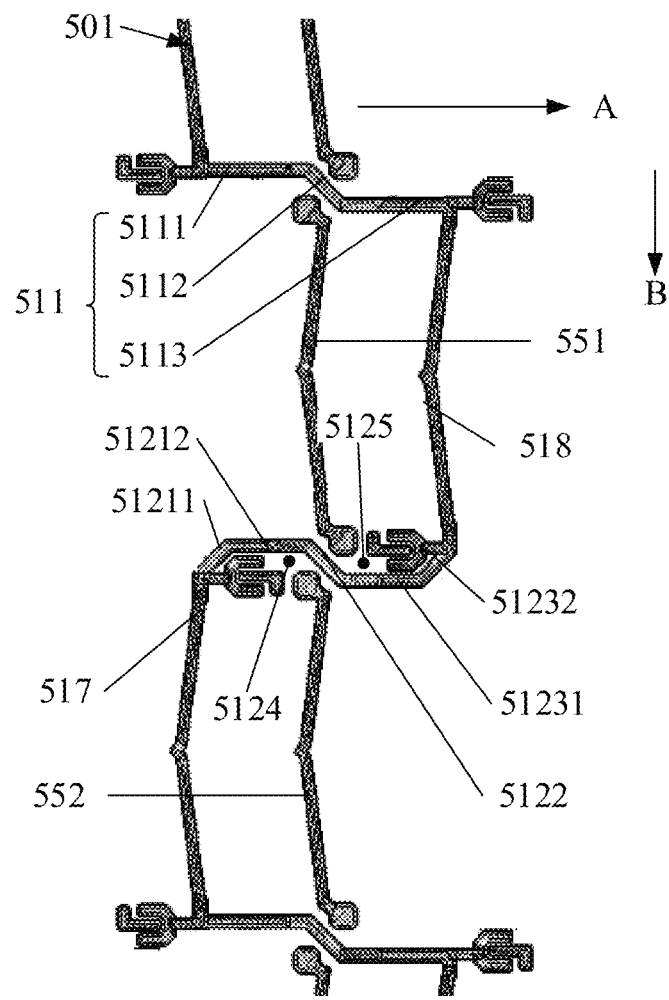

As shown in FIG. 4 and FIG. 5, the plurality of row extension connection units of the first data line 501 includes first row extension connection units 511 and second row extension connection units 512 that are alternately arranged sequentially in rows. A first sub-pixel row is disposed between the first row extension connection units 511 and the second row extension connection units 512. The first row extension connection unit 511a, the second column extension connection unit 518, the second row extension connection unit 512, the first column extension connection unit 517, and the first row extension connection unit 511b collectively form a connection structure.

As shown in FIG. 5, the first row extension connection unit 511 includes a first connection segment 5111, a second connection segment 5112, and a third connection segment 5113 that are sequentially connected. Both of the first connection segment 5111 and the third connection segment 5113 extend in the extending direction of the first strip-shaped area, an acute angle is formed between the extending direction of the second connection segment 5112 and the extending direction of the first strip-shaped area. In this case, the distance between the first connection segment 5111 and the first sub-pixel row is greater than the distance between the second connection segment 5112 and the first sub-pixel row.

As shown in FIG. 5, the second row extension connection unit 512 includes a fourth connection segment 51211, a fifth connection segment 51212, a sixth connection segment 5122, a seventh connection segment 51231, and an eighth connection segment 51232 that are sequentially connected. Each of the fifth connection segment 51212 and the seventh connection segment 51231 extends in the direction opposite to the extending direction of the first strip-shaped area, and an acute angle is formed between the direction opposite to the extending direction of the first strip-shaped area and each of the extending direction of the fourth connection segment 51211, the extending direction of the sixth connection segment 5122, and the extending direction of the eighth connection segment 51232. The fourth connection segment 51211, the fifth connection segment 51212, and the sixth connection segment 5122 enclose a first recessed area 5124. The sixth connection segment 5122, the seventh connection segment 51231 and the eighth connection segment 51232 enclose a second recessed area 5125. The opening direction of the first recessed area 5124 faces the extending direction of the second strip-shaped area, and the opening direction of the second recessed area 5125 is opposite to the second direction. Optionally, the sixth connection segment 5122 is parallel to the second connection segment 5112.

As shown in FIG. 4 and FIG. 5, the first connection segment 5111 and the third connection segment 5113 respectively correspond to one column of sub-pixels, and the column of sub-pixels corresponding to the first connection segment 5111 is adjacent to the column of sub-pixels corresponding to the third connection segment 5113. The second connection segment 5112 corresponds to the second strip-shaped area 92 between the two sub-pixel columns. In addition, the first connection segment 5111, the second connection segment 5112, and the third connection segment 5113 may all be linear connection segments, and the preset acute angle between the second connection segment 5112 and the second direction may be 45°. Since the space between the first connection segment 5111 and the first sub-pixel row is relatively large, the source 52, the drain 53 and the via hole may be disposed in the space. The fifth connection segment 51212 and the first connection segment 5111 correspond to the same column of sub-pixels, and the third connection segment 5113 and the seventh connection segment 51231 correspond to the same column of sub-pixels. The first recessed area 5124 and the second recessed area 5125 may be configured to accommodate the source 52, the drain 53, and the via hole.

As shown in FIG. 5, one end of the fourth connection segment 51211 is connected to the fifth connection segment 51212, and the other end of the fourth connection segment 51211 is connected to the first column extension connection unit 517. The distance between the fourth connection segment 51211 and the sixth connection segment 5122 gradually increases along the second direction. One end of the seventh connection segment 51231 is connected to one end of the sixth connection segment 5122, and the other end of the seventh connection segment 51231 is connected to the eighth connection segment 51232. One end, distal from the seventh connection segment 51231, of the eighth connection segment 51232 is connected to the second column extension connection unit 518. The distance between the sixth connection segment 5122 and the eighth connection segment 51232 gradually decreases along the second direction. The distance between the fifth connection segment 51212 and the fifth sub-pixel P5 may be equal to the distance between the seventh connection segment 51231 and the sixth sub-pixel P6. As shown in FIG. 4, the fifth sub-pixel P5 is disposed on a side of the opening of the first recessed area 5124, that is, the fifth sub-pixel P5 is disposed between the first connection segment 5111 corresponding to the next sub-pixel row and the fifth connection segment 51212. The sixth sub-pixel P6 is disposed on a side of the opening of the second recessed area 5125, that is, the sixth sub-pixel P6 is disposed between the third connection segment 5113 and the seventh connection segment 51231.

As shown in FIG. 4 and FIG. 5, the thin film transistor 101 of the fourth sub-pixel P4 is disposed in the first strip-shaped area 91 between the fourth sub-pixel P4 and the first connection segment 5111 as well as the second connection segment 5112. The fourth sub-pixel P4 is backed by the opening of the first recessed area 5124, that is, the fourth sub-pixel P4 is disposed between the first connection segment 5111 and the fourth connection segment 51211. The thin film transistor 102 of the fifth sub-pixel P5 is disposed in the first recessed area 5124, that is, the thin film transistor 102 is disposed in the first strip-shaped area 91 between the fifth connection segment 51212 and the fifth sub-pixel P5. The thin film transistor 103 of the sixth sub-pixel P6 is disposed in the second recessed area 5125, that is, the thin film transistor 103 is disposed in the first strip-shaped area 91 between the seventh connection segment 51231 and the sixth sub-pixel P6. The thin film transistor 104 of the seventh sub-pixel P7 is disposed in the first strip-shaped area 91 between the seventh sub-pixel P7 and the third connection segment 5113 as well as a second connection segment 5112, that is, the thin film transistor 104 is disposed in the first strip-shaped area 91 between the seventh sub-pixel P7 and the third connection segment 5113 as well as the second connection segment 5112 corresponding to the next sub-pixel row. The seventh sub-pixel P7 is backed by the opening of the second recessed area 5125, that is, the seventh sub-pixel P7 is disposed between the seventh connection segment 51231 and the third connection segment 5113 corresponding to the next sub-pixel row. Here, the fourth sub-pixel P4 and the sixth sub-pixel P6 belong to the first sub-pixel row, and the fifth sub-pixel P5 and the seventh sub-pixel P7 belong to the second sub-pixel row.

Furthermore, as shown in FIG. 4 and FIG. 5, the common electrode signal line 55 includes a plurality of common electrode signal line segments. The plurality of common electrode signal line segments includes a first common line segment 551 and a second common line segment 552. The first common line segment 551 is disposed between the fourth sub-pixel P4 and the sixth sub-pixel P6. Optionally, two ends of the first common line segment 551 extend from the second strip-shaped area 92 to the first strip-shaped area 91 in opposite directions. The first end of the first common line segment 551 extends toward the thin film transistor 101 of the fourth sub-pixel P4, and the second end of the first common line segment 551 extends toward the thin film transistor 103 of the sixth sub-pixel P6. The second common line segment 552 is disposed between the fifth sub-pixel P5 and the seventh sub-pixel P7. Optionally, two ends of the second common line segment 552 extend from the second strip-shaped area 92 to the first strip-shaped area 91 in opposite directions. The first end of the second common line segment 552 extends toward the thin film transistor 102 of the fifth sub-pixel P5, and the second end of the second common line segment 552 extends toward the thin film transistor 104 of the seventh sub-pixel P6. Here, the first end and the second end of the first common line segment 551 are opposite ends, and the first end and the second end of the second common line segment 552 are opposite ends.

Both ends of each of the first common line segment 551 and the second common line segment 552 are provided with via hole connection portions. The via holes correspond to the via hole connection portions, and the via hole connection portion is configured to be connected to the common electrode layer 6 through the via hole. The via hole connection portion of the first common line segment 551 proximal to the first connection segment 5111 is disposed between the second connection segment 5112 and the fourth sub-pixel P4. The via hole connection portion of the first common line segment 551 proximal to the sixth connection segment 5122 is disposed in the second recessed area 5125. The via hole connection portion of the second common line segment 552 proximal to the sixth connection segment 5122 is disposed in the first recessed area 5124. The via hole connection portion of the second common line segment 552 proximal to the second connection segment 5112 corresponding to the next pixel row is disposed between the seventh sub-pixel P7 and the second connection segment 5112 corresponding to the next pixel row.

Figure 6:
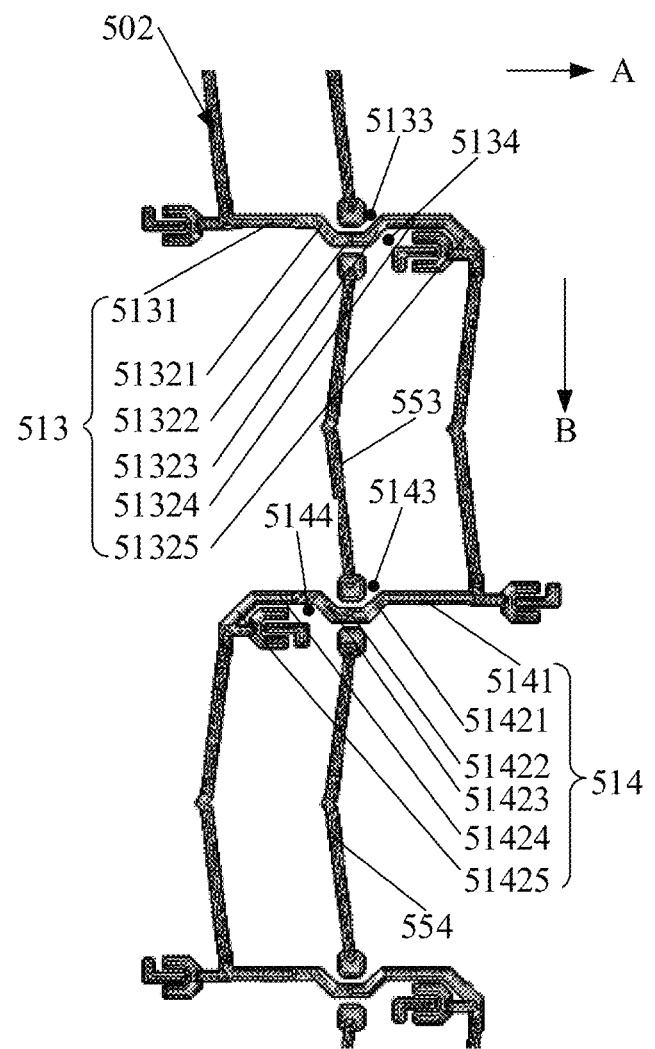
FIG. 6 schematically shows a schematic structural diagram of still another source-drain layer of an array substrate according to an embodiment of the present disclosure.

As shown in FIG. 6, the plurality of row extension connection units of the second data line 502 includes third row extension connection units 513 and fourth row extension connection units 514 that are alternately arranged sequentially in rows. The third row extension connection unit 513 includes a ninth connection segment 5131, a tenth connection segment 51321, an eleventh connection segment 51322, a twelfth connection segment 51323, a thirteenth connection segment 51324 and a fourteenth connection segment 51325 that are sequentially connected. Each of the ninth connection segment 5131, the eleventh connection segment 51322 and the thirteenth connection segment 51324 extends along the extending direction of the first strip-shaped area. An acute angle is formed between the extending direction of the first strip-shaped area and each of the extending direction of the tenth connection segment 51321, the extending direction of the twelfth connection segment 51323, and the extending direction of the fourteenth connection segment 51325. The distance between the tenth connection segment 51321 and the twelfth connection segment 51323 gradually decreases along the second direction. The tenth connection segment 51321, the eleventh connection segment 51322 and the twelfth connection segments 51323 enclose a third recessed area 5133. The twelfth connection segment 51323, the thirteenth connection segment 51324 and the fourteenth connection segment 51325 enclose a fourth recessed area 5134. The opening direction of the third recessed area 5133 and the opening direction of the fourth recessed area 5134 are opposite. The opening direction of the fourth recessed area 5134 faces the extending direction of the second strip-shaped area.

Optionally, the recess depth of the third recessed area 5133 is less than the recess depth of the fourth recessed area 5134. The recess depth of the third recessed area 5133 refers to the distance between the end, connected to the ninth connection segment 5131, of the tenth connection segment 51321 and the eleventh connection segment 51322. The line that the eleventh connection segment 51322 is on can divide the first strip-shaped area 91 where the eleventh connection segment 51322 is disposed into two strip-shaped areas of equal width. The recess depth of the fourth recessed area 5134 refers to the distance between the end, backed by the thirteenth connection segment 51324, of the fourteenth connection segment 51325 and the thirteenth connection segment 51324. The ninth connection segment 5131 and the thirteenth connection segment 51324 may be in the same straight line.

The fourth row extension connection unit 514 includes a fifteenth connection segment 5141, a sixteenth connection segment 51421, a seventeenth connection segment 51422, a eighteenth connection segment 51423, a nineteenth connection segment 51424 and a twentieth connection segment 51425 that are sequentially connected. Each of the fifteenth connection segment 5141, the seventeenth connection segment 51422 and the nineteenth connection segment 51424 extends in the direction opposite to the extending direction of the first strip-shaped area, and an acute angle is formed between the direction opposite to the extending direction of the first strip-shaped area and each of the extending direction of the sixteenth connection segment 51421, the extending direction of the eighteenth connection segment 51423 and the extending direction of the twentieth connection segment 51425. The distance between the twelfth connection segment 51323 and the fourteenth connection segment 51325 gradually increases along the second direction. The sixteenth connection segment 51421, the seventeenth connection segment 51422 and the eighteenth connection segment 51423 enclose a fifth recessed area 5143. The eighteenth connection segment 51423, the nineteenth connection segment 51424 and the twentieth connection segment 51425 enclose a sixth recessed area 5144. The opening direction of the sixth recessed area 5144 faces the extending direction of the second strip-shaped area, and the opening direction of the fifth recessed area 5143 is opposite to the opening direction of the sixth recessed area 5144. Optionally, the recess depth of the fifth recessed area 5143 is less than the recess depth of the sixth recessed area 5144.

As shown in FIG. 4 and FIG. 6, an eighth sub-pixel P8 is disposed on a side of the opening of the fourth recessed area 5134, and the thin film transistor 105 of the eighth sub-pixel P8 is disposed in the fourth recessed area 5134. A ninth sub-pixel P9 is backed by the opening of the sixth recess area 5144, and the thin film transistor 106 of the ninth sub-pixel P9 is disposed in the first strip-shaped area between the ninth sub-pixel P9 and the ninth connection segment 5131. A tenth sub-pixel P10 is backed by the opening of the fourth recessed area 5134 corresponding to the next pixel row, and the thin film transistor 107 of the tenth sub-pixel P10 is disposed in the first strip-shaped area between the tenth sub-pixel P10 and the fifteenth connection segment 5141. An eleventh sub-pixel P11 is disposed on a side of the opening of the sixth recessed area 5144, and the thin film transistor 108 of the eleventh sub-pixel P11 is disposed in the sixth recessed area 5144.

As shown in FIG. 4 and FIG. 6, the plurality of common electrode signal line segments further include a third common line segment 553 and a fourth common line segment 554. The third common line segment 553 is disposed in the second strip-shaped area 92 between the eighth sub-pixel P8 and the ninth sub-pixel P9. The first end of the third common line segment 553 is backed by the opening of the third recessed area 5133, and the second end of the third common line segment 553 is disposed in the fifth recessed area 5143. The fourth common line segment 554 is disposed between the tenth sub-pixel P10 and the eleventh sub-pixel P11. The first end of the fourth common line segment 554 is backed by the opening of the fifth recessed area 5143, and the second end of the fourth common line segment 554 is disposed in the third recessed area 5133 corresponding to the next pixel row. The first end and the second end of the third common line segment 553 are opposite ends, and the first end and the second end of the fourth common line segment 554 are opposite ends.

Both ends of each of the third common line segment 553 and the fourth common line segment 554 are provided with via hole connection portions. The via holes correspond to the via hole connection portions, and the via hole connection portion is configured to be connected to the common electrode layer 6 through the via hole. The via hole connection portion at the first end of the third common line segment 553 is disposed on the side, backed by the opening of the third recessed area 5133, of the eleventh connection segment 51322, and the via hole connection portion at the second end of the third common line segment 553 is disposed in the fifth recessed area 5143.

As shown in FIG. 4, the plurality of row extension connection units of the third data line 503 includes fifth row extension connection units 515 and sixth row extension connection units 516 that are alternately arranged sequentially in rows. The first row extension connection unit 511, the third row extension connection unit 513 and the fifth row extension connection unit 515 may be disposed in the same first strip-shaped area 91, and the second row extension connection unit 512, the fourth row extension connection unit 514 and the sixth row extension connection unit 516 may be disposed in the same first strip-shaped area 91.

Figure 7:
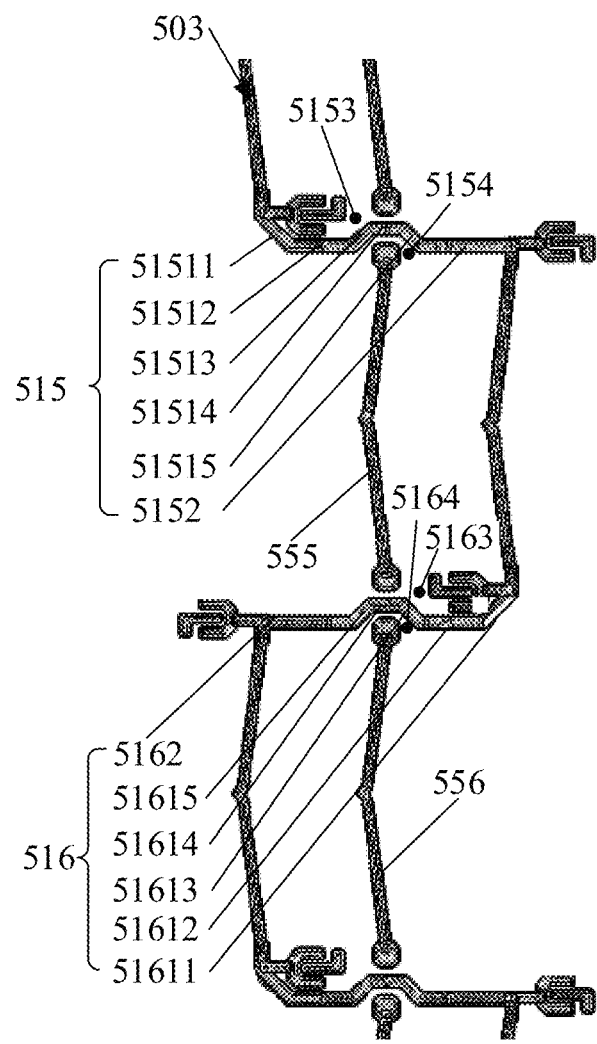
FIG. 7 schematically shows a schematic structural diagram of yet another source-drain layer of an array substrate according to an embodiment of the present disclosure.

As shown in FIG. 7, the fifth row extension connection unit 515 includes a twenty-first connection segment 51511, a twenty-second connection segment 51512, a twenty-third connection segment 51513, a twenty-fourth connection segment 51514, a twenty-fifth connection segment 51515 and a twenty-sixth connection segment 5152 that are sequentially connected. Each of the twenty-second connection segment 51512, the twenty-fourth connection segment 51514 and the twenty-sixth connection segment 5152 extends along the extending direction of the first strip-shaped area. An acute angle is formed between the extending direction of the first strip-shaped area and each of the extending direction of the twenty-first connection segment 51511, the extending direction of the twenty-third connection segment 51513 and the extending direction of the twenty-fifth connection segment 51515. The distance between the twenty-first connection segment 51511 and the twenty-third connection segment 51513 gradually decreases along the second direction. The distance between the twenty-third connection segment 51513 and the twenty-fifth connection segment 51515 gradually increases along the second direction. The twenty-first connection segment 51511, the twenty-second connection segment 51512 and the twenty-third connection segment 51513 enclose a seventh recessed area 5153. The twenty-third connection segment 51513, the twenty-fourth connection segments 51514 and the twenty-fifth connection segment 51515 enclose an eighth recessed area 5154. The opening direction of the eighth recessed area 5154 faces the extending direction of the second strip-shaped area, and the opening direction of the seventh recessed area 5153 is opposite to the opening direction of the eighth recessed area 5154. Optionally, the recess depth of the eighth recessed area 5154 is less than the recess depth of the seventh recessed area 5153. The distance between the end, distal from the twenty-second connection segment 51512, of the twenty-first connection segment 51511 and the twenty-second connection segment 51512 is the recess depth of the seventh recessed area 5153. The distance between then end, distal from the twenty-fourth connection segment 51514, of the twenty-third connection segment 51513 and the twenty-fourth connection segment 51514 is the recess depth of the eighth recessed area 5154.

As shown in FIG. 7, the sixth row extension connection unit 516 includes a twenty-seventh connection segment 51611, a twenty-eighth connection segment 51612, a twenty-ninth connection segment 51613, a thirtieth connection segment 51614, a thirty-first connection segment 51615 and the thirty-second connection segment 5162 that are sequentially connected. Each of the twenty-eighth connection segment 51612, the thirtieth connection segment 51614 and the thirty-second connection segment 5162 extends in the direction opposite to the extending direction of the first strip-shaped area. An acute angle is formed between the direction opposite to the extending direction of the first strip-shaped area and each of the extending direction of the twenty-seventh connection segment 51611, the extending direction of the twenty-ninth connection segment, and the extending direction of the thirty-first connection segment 51615. The twenty-seventh connection segment 51611, the twenty-eighth connection segment 51612 and the twenty-ninth connection segment 51613 enclose a ninth recessed area 5163. The twenty-ninth connection segment, the thirtieth connection segment 51614 and the thirty-first connection segment 51615 enclose a tenth recessed area 5164. The opening direction of the tenth recessed area 5164 faces the extending direction of second strip-shaped area, and the opening direction of the ninth recessed area 5163 is opposite to the opening direction of the tenth recessed area 5164.

As shown in FIG. 4, the first row extension connection unit 511, the second row extension connection unit 512, the third row extension connection unit 513, the fourth row extension connection unit 514, the fifth row extension connection unit 515 and the sixth row extension connection unit 516 are all row extension connection units. In addition, the first connection segment 5111, the ninth connection segment 5131 and the thirteenth connection segment 51324 may be on the same straight line. The third connection segment 5113, the eleventh connection segment 51322 of the third row extension connection unit, the twenty-second connection segment 51512 and the twenty-sixth connection segment 5152 of the fifth row extension connection unit are disposed on the same straight line. The fifth connection segment 51212, the thirteenth connection segment 51324, the ninth connection segment 5131, and the twenty-fourth connection segment 51514 of the sixth row extension connection unit are disposed on the same straight line. The seventh connection segment 51231, the eleventh connection segment 51322, the twenty-sixth connection segment 5152 and the twenty-second connection segment 51512 are disposed on the same straight line.

As shown in FIG. 4 and FIG. 7, a twelfth sub-pixel P12 is disposed on a side of the opening of the ninth recessed area 5163, and the thin film transistor 109 of the twelfth sub-pixel P12 is disposed in the ninth recessed area 5163. A thirteenth sub-pixel P13 is backed by the opening of the seventh recessed area 5153, and the thin film transistor 110 of the thirteenth sub-pixel P13 is disposed in the first strip-shaped area 91 between the thirteenth sub-pixel P13 and the thirty-second connection segment 5162. A fourteenth sub-pixel P14 is disposed on a side of the opening of the seventh recessed area 5153 corresponding to the next pixel row, and the thin film transistor 111 of the fourteenth sub-pixel P14 is disposed in the seventh recessed area 5153 corresponding to the next pixel row. A fifteenth sub-pixel P15 is backed by the opening of the ninth recessed area 5163, and the thin film transistor 112 of the fifteenth sub-pixel P15 is disposed in the first strip-shaped area between the fifteenth sub-pixel P15 and the twenty-sixth connection segment 5152 corresponding to the next pixel row.

As shown in FIG. 4 and FIG. 7, the plurality of common electrode signal line segments further includes a fifth common line segment 555 and a sixth common line segment 556. The fifth common line segment 555 is disposed in the second strip-shaped area 92 between the twelfth sub-pixel P12 and the thirteenth sub-pixel P13. The first end of the fifth common line segment 555 is disposed in the eighth recessed area 5154, and the second end of the fifth common line segment 555 is backed by the opening of the tenth recessed area 5164. The sixth common line segment 556 is disposed in the second strip-shaped area 92 between the fourteenth sub-pixel P14 and the fifteenth sub-pixel P15. The first end of the sixth common line segment 556 is disposed in the tenth recessed area 5164, and the second end of the sixth common line segment 556 is disposed on a side of the eighth recessed area 5154 corresponding to the next pixel row backed by the opening of the eighth recessed area 5154.

Both ends of each of the fifth common line segment 555 and the sixth common line segment 556 are provided with via hole connection portions. The via holes correspond to the via hole connection portions, and the via hole connection portion is configured to be connected to the common electrode layer 6 through the via hole. The via hole connection portion at one end of the fifth common line segment 555 is disposed on a side, backed by the opening of the tenth recessed area 5164, of the thirtieth connection segment 51614, and the via hole connection portion at the other end of the fifth common line segment 555 is disposed in the eighth recessed area 5154.

As shown in FIG. 9, the pixel electrode 54 includes a second body portion 541 and a second connection portion 542. The second connection portion 542 is lapped with the drain 53, and the second connection portion 542 of the pixel electrode 54 in each sub-pixel is disposed in correspondence with a thin film transistor. The second body portion 541 in each pixel electrode 54 has the same area, and the second connection portion 542 in each pixel electrode 54 has the same area. The pixel electrode 54 is configured to form capacitance together with the common electrode 61, and the capacitance value depends on the direct facing area between the pixel electrode 54 and the common electrode 61. In the embodiment of the present disclosure, since the orthographic projection of the pixel electrode 54 on the common electrode layer 6 is completely within the area where the common electrode 61 is, that is, the direct facing area between each pixel electrode 54 and the corresponding common electrode 61 is the same. Therefore, the capacitance value of the capacitance corresponding to each sub-pixel may be ensured to be equal, which can avoid flickers from occurring in the display device.

In the embodiment of the present disclosure, the routing shape of the data lines and positions of the thin film transistors are reasonably set according to the above solution. Since position of thin film transistor corresponds to the position of the second connection portion of pixel electrode, the structures of the second connection portions of the respective pixel electrodes are ensured to be the same according to the above arrangement, thereby ensuring that capacitance values of the capacitance of the respective sub-pixels are the same.

Figure 10:
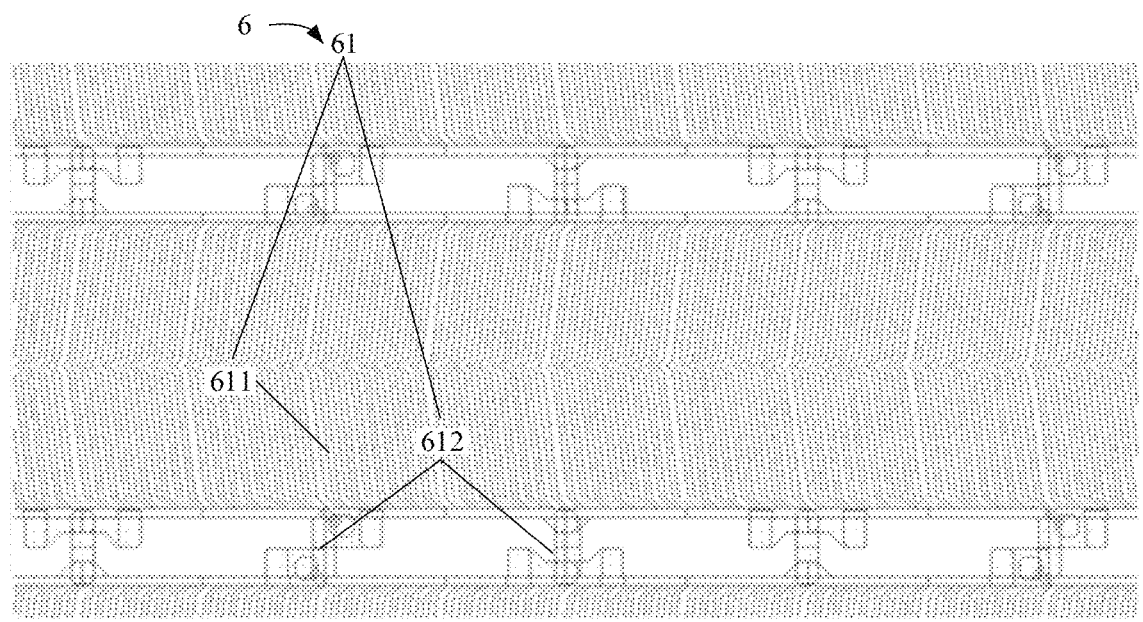

Optionally, as shown in FIG. 10, the common electrode layer 6 includes a plurality of common electrodes 61 arranged in an array, and the common electrode 61 is connected to the adjacent common electrode signal line 55 through the via hole. Each sub-pixel includes a common electrode 61, and the common electrode 61 includes a first body portion 611 and a first connection portion 612. The first body portions 611 disposed on two sides of the common electrode signal line 55 share one first connection portion 612, that is, each first connection portion 612 is connected to the first body portions 611 of two common electrodes 61. The first connection portion 612 is connected to the via hole connection portion. The first body portion 611 is disposed at two ends of each first connection portion 612, and the structure of the first connection portion 612 is determined based on the position of the corresponding via hole connection portion.

Figure 12:
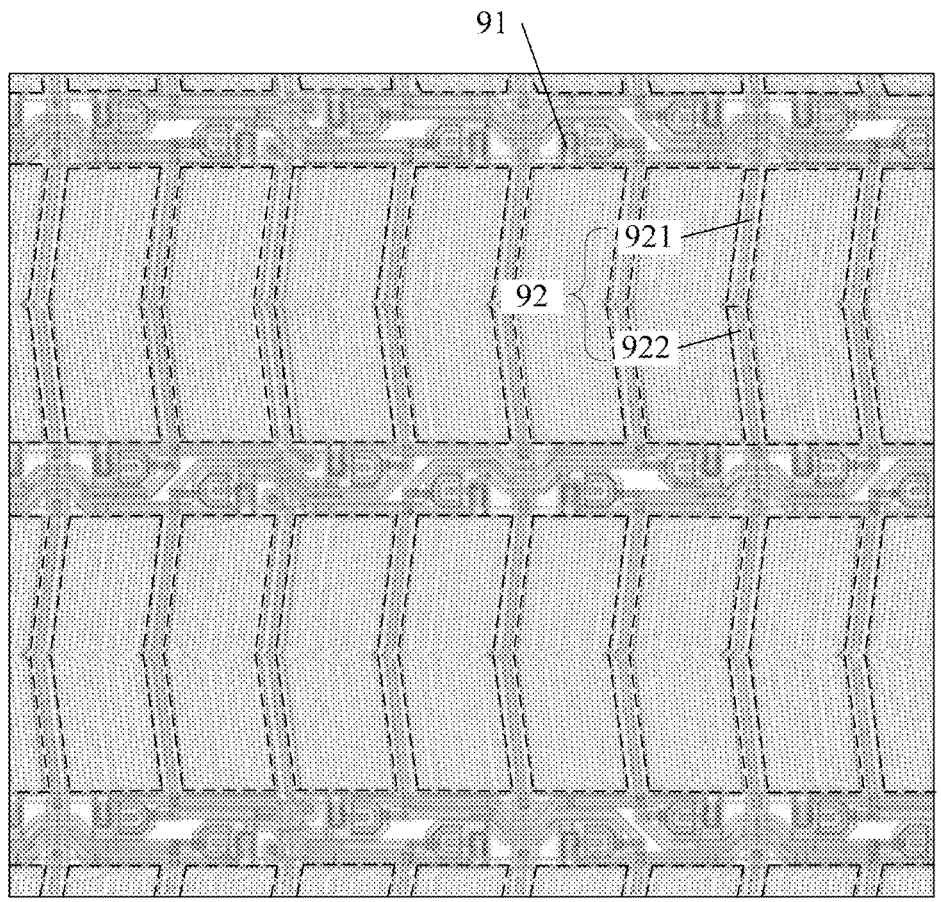
FIG. 12 schematically shows another schematic structural diagram of an array substrate according to an embodiment of the present disclosure.

In addition, as shown in FIG. 12, the second strip-shaped area 92 passing through any sub-pixel row may include a first gap 921 and a second gap 922, and a preset angle is formed between the first gap 921 and the second gap 922. One second strip-shaped area 92 on the array substrate may be divided into a plurality of segments by the first strip-shaped area 91, and each segment passes through one sub-pixel row. Correspondingly, the first column extension connection unit and the second column extension connection unit disposed in the second strip-shaped area 92 may also include two segments with a preset angle therebetween, and the extending direction of one of the two segments of any column extension connection unit may be the same as the extending direction of the first gap 921, and the extending direction of the other one of the two segments may be the same as the extending direction of the second gap 922. In this case, the common electrode signal line disposed in the second strip-shaped area 92 also includes a first segment and a second segment that are connected, and preset angle is formed between the first segment and the second segment. The extending directions of the first segment and the second segment are the same as the extending directions of the first gap 921 and the second gap 922, respectively. In addition, each common electrode 61 includes a first portion and a second portion. The extending direction of the first portion is the same as the extending direction of the first gap 921, and the extending direction of the second portion is the same as the extending direction of the second gap 922. Similarly, each pixel electrode may also include two portions with a preset angle therebetween.

In summary, in the array substrate according to the embodiments of the present disclosure, by connecting each common electrode signal line segment to the common electrode layer, effective connection between the plurality of common electrode signal line segments can be achieved. In addition, since the common electrode signal line is disposed in the same layer as the sources, the drains, and data lines, the arrangement of the common electrode signal line does not increase the process difficulty or production cost. Additionally, when the common electrode signal line is made of the same material as the sources, the drains, and the data lines, the common electrode signal line, the sources, the drains, and the data lines may be formed by one-time patterning process, without the need to separately provide a mask for the common electrode signal line 55, which can further reduce the manufacturing process of the array substrate.

In addition, the common electrode signal line and the common electrode layer jointly transmit the com voltage, which is equivalent to the connection of a resistor in parallel to the common electrode layer. Therefore, the impedance is low during the transmission of the com voltage, that is, the impedance during the transmission of the com voltage is reduced. Thus, by connecting each common electrode signal line segment to the common electrode layer, not only a jump connection of the common electrode signal line through the common electrode layer is achieved, but also the resistance of the common electrode signal line is reduced, which improves the uniformity of the common electrode signal line.

An embodiment of the present disclosure further provides a display device. The display device includes the array substrate according to above embodiments. Therefore, the present embodiment includes all advantageous effects of the array substrate according to any of above embodiments, which are not repeated herein.

Figure 13:
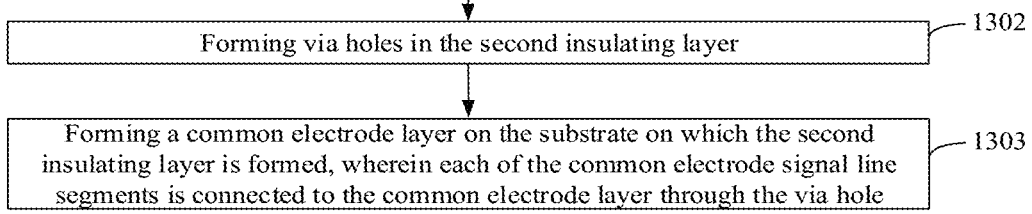
FIG. 13 schematically shows a flowchart of a method for manufacturing an array substrate according to an embodiment of the present disclosure.

An embodiment of the present disclosure provides a method for manufacturing an array substrate. This method is applied to manufacture the array substrate according to the above embodiments. As shown in FIG. 13, the method includes following steps.

In step 1301, a gate layer, a first insulating layer, a channel layer, a source-drain layer, and a second insulating layer are sequentially formed on a substrate, wherein the source-drain layer includes a plurality of sources, a plurality of drains, a plurality of data lines and a plurality of common electrode signal lines, the common electrode signal line includes a plurality of common electrode signal line segments, and each of the common electrode signal line segments passes through at least one sub-pixel row.

In step 1302, via holes are formed in the second insulating layer.

In step 1303, a common electrode layer is formed on the substrate on which the second insulating layer is formed, wherein each of the common electrode signal line segments is connected to the common electrode layer through the via hole.

In the related art, a separate metal layer needs to be additionally formed on the second insulating layer, and the metal layer is in a jump connection with the common electrode, which complicates the manufacturing process of the array substrate and increases the thickness of the array substrate. In the array substrate formed by the manufacturing method according to the embodiments of the present disclosure, the plurality of drains, the plurality of data lines, and the plurality of common electrode signal lines may be formed at the same time, which reduces simplifies manufacturing process. Moreover, since the source-drain layer is disposed in the same layer as the common electrode signal lines, the thickness of the array substrate is reduced.

The above descriptions are merely example embodiments of the present disclosure, and the protection scope of the present disclosure is not limited thereto. Any changes or substitutions that may be easily derived by those skilled in the art within the technical scope disclosed in the present disclosure shall be covered by the protection scope of the present disclosure. Therefore, the protection scope of the present disclosure should be subject to the protection scope of the claims.

What is claimed is:

1. An array substrate, comprising: a gate layer, a first insulating layer, a channel layer, a source-drain layer, a second insulating layer, and a common electrode layer that are sequentially stacked, the second insulating layer comprising via holes formed therein,
    wherein the source-drain layer comprises a plurality of sources, a plurality of drains, a plurality of data lines and a plurality of common electrode signal lines, the common electrode signal line comprises a plurality of common electrode signal line segments, each of the common electrode signal line segments passing through at least one sub-pixel row, and each of the common electrode signal line segments being connected to the common electrode layer through the via hole; and
    the array substrate comprises a plurality of pixel units arranged in an array, wherein each of the pixel units comprises a plurality of sub-pixels of different colors, a first strip-shaped area is between adjacent two sub-pixel rows, and a second strip-shaped area is between adjacent two sub-pixel columns;
    each of the data lines comprises a plurality of row extension connection units and a plurality of column extension connection units, one column extension connection unit being connected between every two row extension connection units, wherein the plurality of column extension connection units comprises a plurality of first column extension connection units and a plurality of second column extension connection units, a first end of any row extension connection unit being connected to one of the first column extension connection units, and a second end of the any row extension connection unit being connected to one of the second column extension connection units; the plurality of row extension connection units in a same data line are respectively disposed in a plurality of first strip-shaped areas between a same group of sub-pixel columns, each group of sub-pixel columns comprising at least one sub-pixel column; the plurality of first column extension connection units in a same data line are all disposed in a same second strip-shaped area; and the plurality of the second column extension connection units in a same data line are disposed in another second strip-shaped area, each of the column extension connection units passing through one sub-pixel row; and
    the plurality of common electrode signal line segments are all disposed in the second strip-shaped areas, each of the common electrode signal line segments passes through one sub-pixel row, and the common electrode signal line segments and the column extension connection units are disposed alternately in a plurality of second strip-shaped areas between sub-pixels in a same sub-pixel row.

2. The array substrate according to claim 1, wherein the gate layer comprises a plurality of gate lines and a plurality of gates, two of the gate lines being disposed side by side in a same first strip-shaped area, and the gate line extending in an extending direction of the first strip-shaped area; and for any pixel unit in any row, a gate of a first sub-pixel in the pixel unit is connected to one of a first gate line and a second gate line, and a gate of a second sub-pixel in the pixel unit is connected to the other one of the first gate line and the second gate line; and gates of third sub-pixels in two pixel units adjacent to the pixel unit are respectively connected to the first gate line and the second gate line, wherein the first gate line is disposed on an upper side of the any pixel unit and is adjacent to the any pixel unit, and the second gate line is disposed on a lower side of the any pixel unit and is adjacent to the any pixel unit.

3. The array substrate according to claim 1, wherein the plurality of row extension connection units comprises first row extension connection units and second row extension connection units that are alternately disposed sequentially in rows, wherein the first row extension connection unit comprises a first connection segment, a second connection segment and a third connection segment that are sequentially connected, wherein both the first connection segment and the third connection segment extend in an extending direction of the first strip-shaped area, and an acute angle is formed between an extending direction of the second connection segment and the extending direction of the first strip-shaped area; and the second row extension connection unit comprises a fourth connection segment, a fifth connection segment, a sixth connection segment, a seventh connection segment and an eighth connection segment that are sequentially connected, wherein both the fifth connection segment and the seventh connection segment extend in a direction opposite to the extending direction of the first strip-shaped area; an acute angle is formed between the direction opposite to the extending direction of the first strip-shaped area and each of an extending direction of the fourth connection segment, an extending direction of the sixth connection segment and an extending direction of the eighth connection segment; the fourth connection segment, the fifth connection segment and the sixth connection segment enclose a first recessed area; and the sixth connection segment, the seventh connection segment and the eighth connection segment enclose a second recessed area, an opening direction of the first recessed area facing an extending direction of the second strip-shaped area, and an opening direction of the second recessed area being opposite to the extending direction of the second strip-shaped area.

4. The array substrate of claim 3, wherein a thin film transistor of a fourth sub-pixel is disposed in a first strip-shaped area between the first connection segment and the fourth sub-pixel, a thin film transistor of a fifth sub-pixel is disposed in the first recessed area, a thin film transistor of a sixth sub-pixel is disposed in the second recessed area, and a thin film transistor of a seventh sub-pixel is disposed in a first strip-shaped area between the third connection segment and the seventh sub-pixel, wherein the fourth sub-pixel is backed by an opening of the first recessed area, the fifth sub-pixel is disposed on a side of the opening of the first recessed area, the sixth sub-pixel is disposed on a side of an opening of the second recessed area, and the seventh sub-pixel is backed by the opening of the second recessed area.

5. The array substrate according to claim 4, wherein the plurality of common electrode signal line segments comprises a first common line segment and a second common line segment, wherein the first common line segment is disposed between the fourth sub-pixel and the sixth sub-pixel, a first end of the first common line segment extending toward the thin film transistor of the fourth sub-pixel, and a second end of the first common line segment extending toward the thin film transistor of the sixth sub-pixel; and the second common line segment is disposed between the fifth sub-pixel and the seventh sub-pixel, a first end of the second common line segment extending toward the thin film transistor of the fifth sub-pixel, and a second end of the second common line segment extending toward the thin film transistor of the seventh sub-pixel.

6. The array substrate according to claim 5, wherein both ends of at least one of the first common line segment and the second common line segment extend from the second strip-shaped area to the first strip-shaped area.

7. The array substrate according to claim 1, wherein the plurality of row extension connection units comprises third row extension connection units and fourth row extension connection units alternately arranged sequentially in rows, wherein the third row extension connection unit comprises a ninth connection segment, a tenth connection segment, an eleventh connection segment, a twelfth connection segment, a thirteenth connection segment, and a fourteenth connection segment that are sequentially connected, wherein each of the ninth connection segment, the eleventh connection segment and the thirteenth connection segment extends along an extending direction of the first strip-shaped area; an acute angle is formed between the extending direction of the first strip-shaped area and each of an extending direction of the tenth connection segment, an extending direction of the twelfth connection segment and an extending direction of the fourteenth connection segment; the tenth connection segment, the eleventh connection segment and the twelfth connection segment enclose a third recessed area; and the twelfth connection segment, the thirteenth connection segment and the fourteenth connection segment enclose a fourth recessed area, an opening direction of the fourth recessed area facing an extending direction of the second strip-shaped area, and an opening direction of the third recessed area being opposite to the opening direction of the fourth recessed area; and the fourth row extension connection unit comprises a fifteenth connection segment, a sixteenth connection segment, a seventeenth connection segment, an eighteenth connection segment, a nineteenth connection segment and a twentieth connection segment that are sequentially connected, wherein each of the fifteenth connection segment, the seventeenth connection segment and the nineteenth connection segment extends in a direction opposite to the extending direction of the first strip-shaped area; an acute angle is formed between the direction opposite to the extending direction of the first strip-shaped area and each of an extending direction of the sixteenth connection segment, an extending direction of the eighteenth connection segment and an extending direction of the twentieth connection segment; the sixteenth connection segment, the seventeenth connection segment and the eighteenth connection segment enclose a fifth recessed area; and the eighteenth connection segment, the nineteenth connection segment and the twentieth connection segment enclose a sixth recessed area, an opening direction of the sixth recessed area facing the extending direction of the second strip-shaped area, and an opening direction of the fifth recessed area being opposite to the opening direction of the sixth recessed area.

8. The array substrate according to claim 7, wherein a thin film transistor of an eighth sub-pixel is disposed in the fourth recessed area, a thin film transistor of a ninth sub-pixel is disposed in a first strip-shaped area between the ninth sub-pixel and the ninth connection segment, a thin film transistor of a tenth sub-pixel is disposed in a first strip-shaped area between the tenth sub-pixel and the fifteenth connection segment, and a thin film transistor of an eleventh sub-pixel is disposed in the sixth recessed area; and
wherein the eighth sub-pixel is disposed on a side of an opening of the fourth recessed area, the ninth sub-pixel is backed by an opening of the sixth recessed area, the tenth sub-pixel is backed by the opening of the fourth recessed area, and the eleventh sub-pixel is disposed on a side of the opening of the sixth recessed area.

9. The array substrate according to claim 8, wherein the plurality of common electrode signal line segments comprises a third common line segment and a fourth common line segment, wherein
the third common line segment is disposed between the eighth sub-pixel and the ninth sub-pixel, a first end of the third common line segment being backed by an opening of the third recessed area, and a second end of the third common line segment being disposed in the fifth recessed area; and
the fourth common line segment is disposed between the tenth sub-pixel and the eleventh sub-pixel, a first end of the fourth common line segment being backed by an opening of the fifth recessed area, and a second end of the fourth common line segment being disposed in the third recessed area.

10. The array substrate according to claim 1, wherein the plurality of row extension connection units comprises fifth row extension connection units and sixth row extension connection units that are alternately arranged sequentially in rows, wherein
the fifth row extension connection unit comprises a twenty-first connection segment, a twenty-second connection segment, a twenty-third connection segment, a twenty-fourth connection segment, a twenty-fifth connection segment and a twenty-sixth connection segment that are sequentially connected, wherein each of the twenty-second connection segment, the twenty-fourth connection segment and the twenty-sixth connection segment extends along an extending direction of the first strip-shaped area; an acute angle is formed between the extending direction of the first strip-shaped area and each of an extending direction of the twenty-first connection segment, an extending direction of the twenty-third connection segment, and an extending direction of the twenty-fifth connection segment; the twenty-first connection segment, the twenty-second connection segment and the twenty-third connection segment enclose a seventh recessed area; and the twenty-third connection segment, the twenty-fourth connection segment and the twenty-fifth connection segment enclose an eighth recessed area, an opening direction of the eighth recessed area facing an extending direction of the second strip-shaped area, and an opening direction of the seventh recessed area being opposite to the opening direction of the eighth recessed area; and
the sixth row extension connection unit comprises a twenty-seventh connection segment, a twenty-eighth connection segment, a twenty-ninth connection segment, a thirtieth connection segment, a thirty-first connection segment and a thirty-second connection segment that are sequentially connected, wherein each of the twenty-eighth connection segment, the thirtieth connection segment and the thirty-second connection segment extends in a direction opposite to the extending direction of the first strip-shaped area; an acute angle is formed between the direction opposite to the extending direction of the first strip-shaped area and each of an extending direction of the twenty-seventh connection segment, an extending direction of the twenty-ninth connection segment, and an extending direction of the thirty-first connection segment; the twenty-seventh connection segment, the twenty-eighth connection segment and the twenty-ninth connection segment enclose a ninth recessed area; and the twenty-ninth connection segment, the thirtieth connection segment and the thirty-first connection segment enclose a tenth recessed area, an opening direction of the tenth recessed area facing the extending direction of the second strip-shaped area, and an opening direction of the ninth recessed area being opposite to the opening direction of the tenth recessed area.

11. The array substrate according to claim 10, wherein a thin film transistor of a twelfth sub-pixel is disposed in the ninth recessed area, a thin film transistor of a thirteenth sub-pixel is disposed in a first strip-shaped area between the thirteenth sub-pixel and the thirty-second connection segment, a thin film transistor of a fourteenth sub-pixel is disposed in the seventh recessed area, and a thin film transistor of a fifteenth sub-pixel is disposed in a first strip-shaped area between the fifteenth sub-pixel and the twenty-sixth connection segment; and
wherein the twelfth sub-pixel is disposed on a side of an opening of the ninth recessed area, the thirteenth sub-pixel is backed by an opening of the seventh recessed area, the fourteenth sub-pixel is disposed on a side of the opening of the seventh recessed area, and the fifteenth sub-pixel is backed by the opening of the ninth recessed area.

12. The array substrate according to claim 11, wherein the plurality of common electrode signal line segments further comprises a fifth common line segment and a sixth common line segment, wherein
the fifth common line segment is disposed between the twelfth sub-pixel and the thirteenth sub-pixel, a first end of the fifth common line segment being disposed in the eighth recessed area, and a second end of the fifth common line segment being backed by an opening of the tenth recessed area; and
the sixth common line segment is disposed between the fourteenth sub-pixel and the fifteenth sub-pixel, a first end of the sixth common line segment being disposed in the tenth recessed area, and a second end of the sixth common line segment backed by an opening of the eighth recessed area.

13. The array substrate according to claim 1, wherein the via holes are all disposed in first strip-shaped areas.

14. The array substrate according to claim 1, wherein a drain of a sub-pixel in the sub-pixel row is connected to a pixel electrode, and all pixel electrodes on the array substrate are equal in area.

15. The array substrate according to claim 1, wherein the common electrode layer comprises a plurality of common electrodes arranged in an array.

16. The array substrate according to claim 1, wherein a second strip-shaped area passing through any sub-pixel row comprises a first gap and a second gap, an angle being formed between the first gap and the second gap.

17. The array substrate according to claim 1, wherein a material of the common electrode layer comprises a light-transmitting material.

18. A display device, comprising an array substrate, wherein the array substrate comprises: a gate layer, a first insulating layer, a channel layer, a source-drain layer, a second insulating layer, and a common electrode layer that are sequentially stacked, the second insulating layer comprising via holes formed therein, wherein
the source-drain layer comprises a plurality of sources, a plurality of drains, a plurality of data lines and a plurality of common electrode signal lines, wherein the common electrode signal line comprises a plurality of common electrode signal line segments, each of the common electrode signal line segments passing through at least one sub-pixel row, and each of the common electrode signal line segments being connected to the common electrode layer through the via hole; and
the array substrate comprises a plurality of pixel units arranged in an array, wherein each of the pixel units comprises a plurality of sub-pixels of different colors, a first strip-shaped area is between adjacent two sub-pixel rows, and a second strip-shaped area is between adjacent two sub-pixel columns;
each of the data lines comprises a plurality of row extension connection units and a plurality of column extension connection units, one column extension connection unit being connected between every two row extension connection units, wherein the plurality of column extension connection units comprises a plurality of first column extension connection units and a plurality of second column extension connection units, a first end of any row extension connection unit being connected to one of the first column extension connection units, and a second end of the any row extension connection unit being connected to one of the second column extension connection units; the plurality of row extension connection units in a same data line are respectively disposed in a plurality of first strip-shaped areas between a same group of sub-pixel columns, each group of sub-pixel columns comprising at least one sub-pixel column; the plurality of first column extension connection units in a same data line are all disposed in a same second strip-shaped area; and the plurality of the second column extension connection units in a same data line are disposed in another second strip-shaped area, each of the column extension connection units passing through one sub-pixel row; and
the plurality of common electrode signal line segments are all disposed in the second strip-shaped areas, each of the common electrode signal line segments passes through one sub-pixel row, and the common electrode signal line segments and the column extension connection units are disposed alternately in a plurality of second strip-shaped areas between sub-pixels in a same sub-pixel row.

19. A method for manufacturing an array substrate, comprising:
forming a gate layer, a first insulating layer, a channel layer, a source-drain layer, and a second insulating layer sequentially on a substrate, wherein the source-drain layer comprises a plurality of sources, a plurality of drains, a plurality of data lines and a plurality of common electrode signal lines, the common electrode signal line comprising a plurality of common electrode signal line segments, each of the common electrode signal line segments passing through at least one sub-pixel row;
forming via holes in the second insulating layer; and
forming a common electrode layer on the substrate on which the second insulating layer is formed, wherein each of the common electrode signal line segments is connected to the common electrode layer through the via hole; and
wherein the array substrate comprises a plurality of pixel units arranged in an array, wherein each of the pixel units comprises a plurality of sub-pixels of different colors, a first strip-shaped area is between adjacent two sub-pixel rows, and a second strip-shaped area is between adjacent two sub-pixel columns;
each of the data lines comprises a plurality of row extension connection units and a plurality of column extension connection units, one column extension connection unit being connected between every two row extension connection units, wherein the plurality of column extension connection units comprises a plurality of first column extension connection units and a plurality of second column extension connection units, a first end of any row extension connection unit being connected to one of the first column extension connection units, and a second end of the any row extension connection unit being connected to one of the second column extension connection units; the plurality of row extension connection units in a same data line are respectively disposed in a plurality of first strip-shaped areas between a same group of sub-pixel columns, each group of sub-pixel columns comprising at least one sub-pixel column; the plurality of first column extension connection units in a same data line are all disposed in a same second strip-shaped area; and the plurality of the second column extension connection units in a same data line are disposed in another second strip-shaped area, each of the column extension connection units passing through one sub-pixel row; and
the plurality of common electrode signal line segments are all disposed in the second strip-shaped areas, each of the common electrode signal line segments passes through one sub-pixel row, and the common electrode signal line segments and the column extension connection units are disposed alternately in a plurality of second strip-shaped areas between sub-pixels in a same sub-pixel row.

* * * * *